(12) United States Patent
Zackoski

(10) Patent No.: US 10,474,637 B2
(45) Date of Patent: Nov. 12, 2019

(54) SYSTEMS, MEDIA AND METHODS FOR VIRTUALIZED DATA COMPRESSION

(71) Applicant: Waziki Corporation, Park Ridge, IL (US)

(72) Inventor: Leon Zackoski, South Charleston, WV (US)

( * ) Notice: Subject to any disclaimer, the term of this patent is extended or adjusted under 35 U.S.C. 154(b) by 649 days.

(21) Appl. No.: 15/238,787

(22) Filed: Aug. 17, 2016

(65) Prior Publication Data

US 2017/0052974 A1 Feb. 23, 2017

Related U.S. Application Data

(60) Provisional application No. 62/208,434, filed on Aug. 21, 2015.

(51) Int. Cl.
| | |
|---|---|
| *G06F 17/30* | (2006.01) |
| *G06F 16/174* | (2019.01) |
| *H03M 7/30* | (2006.01) |
| *H03M 13/00* | (2006.01) |

(52) U.S. Cl.
CPC .......... *G06F 16/1744* (2019.01); *H03M 7/30* (2013.01); *H03M 7/607* (2013.01); *H03M 13/6312* (2013.01)

(58) Field of Classification Search
CPC ..................................................... H03M 7/30

USPC .......................................................... 707/693
See application file for complete search history.

(56) References Cited

U.S. PATENT DOCUMENTS

| | | | | | |
|---|---|---|---|---|---|
| 4,058,298 | A | * | 11/1977 | Duska | B30B 11/245 366/76.1 |
| 5,358,680 | A | * | 10/1994 | Boissonnat | B29C 45/1816 264/177.2 |
| 2008/0244631 | A1 | * | 10/2008 | Lin | G11B 7/08582 720/659 |
| 2009/0113979 | A1 | * | 5/2009 | Wolcken | B23P 9/025 72/393 |

* cited by examiner

*Primary Examiner* — Baoquoc N To
(74) *Attorney, Agent, or Firm* — Dinsmore & Shohl LLP; Monika Jaensson; Bryan Walker

(57) ABSTRACT

Systems, media, and methods for virtualized data compression are provided. For example, a stream of numbered sequences may be generated by transforming an input stream into a sequence of samples each having a predetermined amplitude and a predetermined length. An error correction protocol may be applied through an analysis of a number of bits. A compression routine may be implemented by choosing a number of threads and determining compression depth. The stream analyze may be analyzed utilizing independent component analysis. A specified compression routine may be executed. An output file size may be determined.

20 Claims, 6 Drawing Sheets

SYSTEMS, MEDIA AND METHODS FOR VIRTUALIZED DATA COMPRESSION

CROSS-REFERENCE TO RELATED APPLICATIONS

This application claims the benefit of U.S. Provisional Application 62/208,434, filed Aug. 21, 2015, which is incorporated by reference in its entirety.

TECHNICAL FIELD

The present specification generally relates to data compression and, more specifically, to transform a majority of bits inside the data schema to shrink in size without data loss after transformation during a decode sequence compression.

BACKGROUND

Data compression is the process of transforming or "shrinking" data to a lower factor. Hence "compressed", therefore consuming less space on storage mediums. The data can therefore be allowed to be stored and transmitted over various communications channels via modern telecommunication standards. Either of these processes can either be lossy or lossless as previously predetermined. Decompression is symmetrical, as this would be necessary to restore the compressed data back to the original state.

Many techniques have been used over the years to compress digital data. However, they all are based on the same few basic principles: a statistical coding, a dictionary coding, or a decorrelation (Storer J. A., Data Compression: Method and Theory, Computer Science Press (1993); Williams R. N. Adaptive Data Compression, Kluwer Academic Publishers (1990); Salomon D. Data Compression, Springer (1997).

A major example of statistical coding is Huffman encoding (see, Salomon D. Data Compression, Springer (1997). In this method, it is assumed that certain bytes occur more frequently in the file than others. In the general case of a binary file, produced by a random source, the frequency distribution could be close to uniform, and Hoffman compression will fail.

The dictionary algorithms are variations of the Lempel-Ziv technique of maintaining a "sliding Window" of the most recent processed bytes of data and scanning the Window for sequences of matching bytes. The input data character stream is compared character-by-character with character sequences stored in a dictionary to check for matches. One example of such a scheme is described in U.S. Pat. No. 6,075,470 (Little), entitled 'Block-wise Adaptive Statistical Data Compression', issued on Jun. 13, 2000, that used adaptive statistical block coding.

Lempel-Ziv-Welch (LZW) is a universal lossless data compression algorithm created by Abraham Lempel, Jacob Ziv, and Terry Welch. It was published by Welch in 1984 as an improved implementation of the LZ78 algorithm published by Lempel and Ziv in 1978. The algorithm is simple to implement, and has the potential for very high throughput in hardware implementations. It is the algorithm of the widely used Unix file compression utility compress, and is used in the GIF image format.

These dictionary algorithms require: a) a number of repetitions of the sequence, included in the dictionary; b) inclusion of the dictionary sequence in the output, so that matching rate must be high enough to actually achieve compression; c) exact match between sequences in an input window and a dictionary. For example, the letters 'b' and 'c' do not match, and the compression will fail, while with a binary coding the difference is only one bit.

The decorrelation technique is applied to highly correlated data, like space or medical images, with wavelets or Fast Fourier Transformation, as a set of basic functions for an input image expansion. These transformations are described in details in Rao K. R., Yip P. C., Eds. The Transform and Data Compression Handbook. CRC Press (2001). If the input sequence is highly correlated, the coefficients of this transformation will decay rapidly, and the number of them could be cut-off, providing compression with some loss of information. These losses could be acceptable for a human perception of an image, but unacceptable for compression of text or executable files, which are not correlated, and when no losses are acceptable. It is also unacceptable for correlated diagnostic or intelligence images, for which the high-frequency component can have an important informative value.

One example of the decorrelation technique is described in U.S. Pat. No. 6,141,445 (Castelli et al.), entitled 'Multi-resolution Lossless/Lossy Compression and Storage of Data for Efficient Processing thereof,' that used a lossy technique to produce the losseless compression by means of applying an orthogonal expansion (could be the wavelet expansion) to an input sequence. After an inverse transform and finding residuals between an input data and the wavelet transform. The sequence of residuals could be compressed using statistical techniques. That patent applied this approach to a general case of random binary data, disregarding the fact that it may be not correlated. However, it is not efficient in that case: the sequence of coefficients of these orthogonal transformations does not decay, and it cannot be cut-off.

The data compression process removes redundancy from the data, and this procedure could be related to the process of data encryption. A random number generator is a software program or hardware circuit that uses a recursive mathematical expression or shifted operations in a register, to produce a stream of random numbers. A random number generator is used in the prime art only to encrypt the data, but not to improve compression. See, for example, U.S. Pat. No. 6,122,379 (Barbir), entitled 'Method and Apparatus for Performing Simultaneous Data Compression and Encryption'.

Accordingly, a need exists for systems, media, and methods for more efficient data compression. A simple, fast, and practical implementation solution found in the description below. Specifically, the shortcomings of the above-cited resources are overcome and additional advantages are provided through the provision of a method for processing data, including the cases when the prior source is impossible to use.

SUMMARY

Referring generally to the figures, embodiments of the present disclosure are directed to a method of generating a stream of numbered sequences by transforming an input stream into a sequence of samples each having a predetermined amplitude and a predetermined length. Some embodiments provide for applying an error correction protocol through an analysis of a number of bits. Various embodiments provide for implementing a compression routine by choosing a number of threads and determining compression depth. Embodiments also provide for analyzing the stream utilizing independent component analysis. Still other embodiments provide for executing a specified compression routine. Different embodiments provide for determining an output file size.

In another embodiment, a data compression system generates a stream of numbered sequences by transforming an input stream into a sequence of samples each having a predetermined amplitude and a predetermined length. Embodiments apply an error correction protocol through an analysis of a number of bits. Various embodiments implement a compression routine by choosing a number of threads and determining compression depth. Some embodiments analyze the stream utilizing independent component analysis. Still other embodiments execute a specified compression routine. Various other embodiments determine an output file size.

In yet another embodiment, a computer readable medium embodying computer-executable instructions, that when executed by a processor, cause the processor to execute operations for generating a stream of numbered sequences by transforming an input stream into a sequence of samples each having a predetermined amplitude and a predetermined length. Some embodiments provide for applying an error correction protocol through an analysis of a number of bits. Other embodiments provide for implementing a compression routine by choosing a number of threads and determining compression depth. Still other embodiments provide for analyzing the stream utilizing independent component analysis. Various embodiments provide for executing a specified compression routine. Various other embodiments provide for determining an output file size.

These and additional features provided by the embodiments of the present disclosure will be more fully understood in view of the following detailed description, in conjunction with the drawings.

BRIEF DESCRIPTION OF THE DRAWINGS

The embodiments set forth in the drawings are illustrative and exemplary in nature and not intended to limit the disclosure. The following detailed description of the illustrative embodiments can be understood when read in conjunction with the following drawings, where like structure is indicated with like reference numerals and in which.

DETAILED DESCRIPTION

Figure 1:
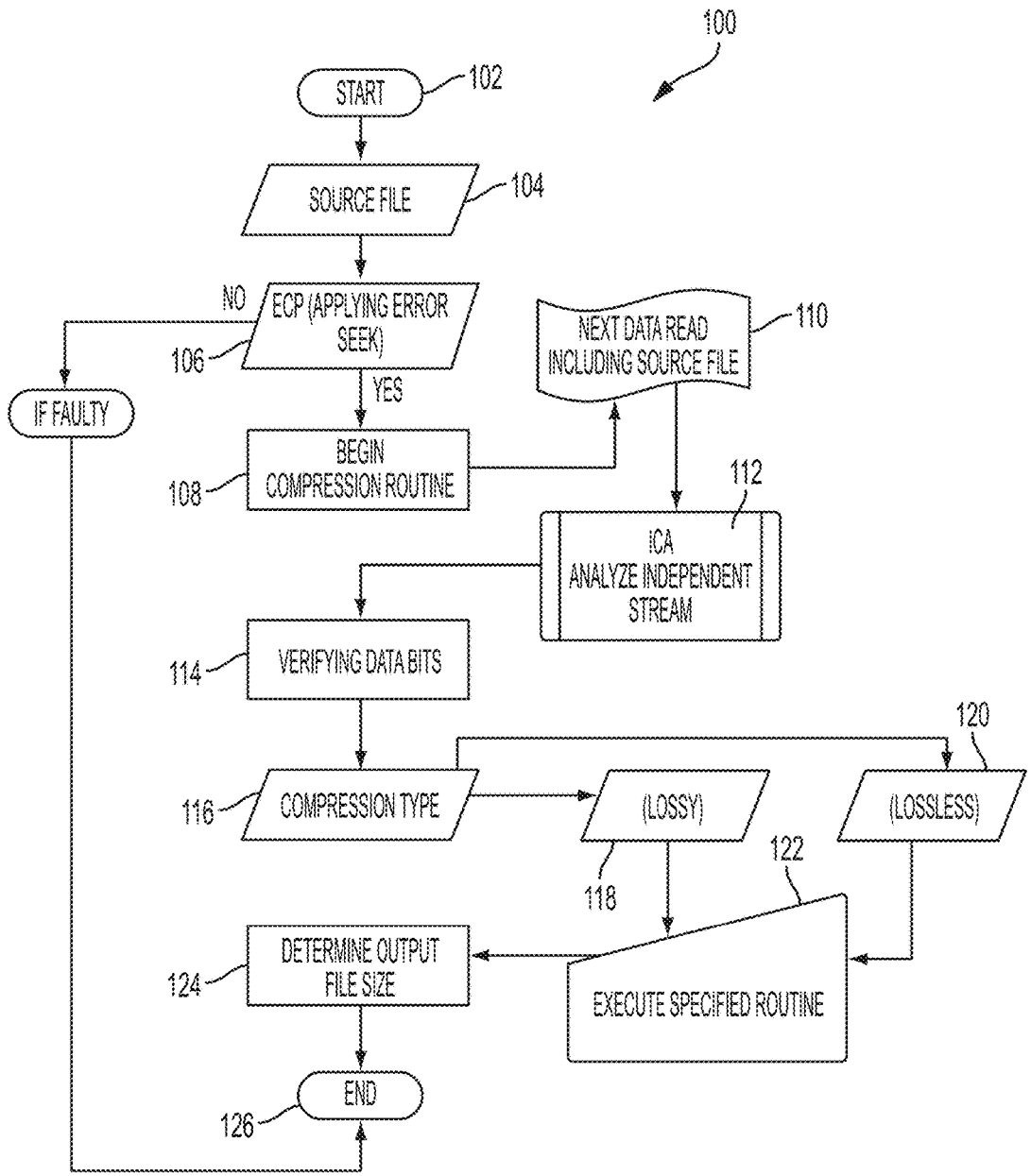
FIG. 1 depicts a flowchart for input of a file to be compressed to a compressed output, according to one or more embodiments shown and described herein.

Referring now to the drawings, FIG. 1 illustrates an exemplary flow chart 100 of Zackoski Modular Transformation (ZMT), beginning with the input of a file to be compressed and terminating with a compressed output, according to one or more embodiments shown and described herein. More specifically, FIG. 1 introduces lossless or lossy approximation of text, an image, virtual disk or executable file with an adaptive transformation generation. At 102, the source file begins with a streamed source file to be inserted.

At 104 a source file, such as the streamed source file, is received as input. An input sequence of a text or binary data is arranged in a sequence of groups or bits (i.e., a stream). Each group is transformed into a sequence of samples of predetermined amplitude and length which then comprises a stream of numbered sequences. A quantitative value distribution is determined for the value of this stream of numbered sequences. An adaptive transformation generation may be used to generate a specific numerical sequence that covers a range of changes of a stream of numbered sequences, and this adaptive transformation generation is then applied to the current encode (bits). Transformative processes then take place against a peak encode value within encoding tables. This function is then determined either as the range or the mean value. In some embodiments, the instant compression method can then decide whether or not to eliminate an infinite size cap. Usually preoccupying a larger data set is eliminated, which in turn eliminates the probability of corrupted or inaccurate data sets from a statistical standpoint. The memory and resource footprint are reduced in any storage matrix from this standpoint. Each sample of a binary input number sequence is compared to all samples of a dictionary sequence in a look-up operation, until a dictionary sample is then found that has a least distance to the current binary input number sequence sample. The input sequence may then be replaced with the sequences of the least distances and the indexes of the dictionary samples which produced these distances. The need to produce an exactly matched dictionary is conveniently eliminated. With this, the dictionary itself is eliminated from the memory, and may not comprise a part of the compressed data, and thereby the rate of the data compression can be improved further. As a result, an unpredictable and perhaps even uniformly distributed input sequence may be transformed to the new sequence, where the subsequence of distances contains many repetitions and zeros. Thus applying currently available statistical or dictionary means to this new sequence provides better results of compression, than if applied to the original sequence.

At 106 an error correction profile, applying error seek, is performed, as discussed in more detail below with respect to FIG. 2. Error Correction Profile analyzes the varied data stream within the source component encapsulation in order to determine N number of bits inside of the data stream. In some embodiments, this is for data re-encode decode only. In embodiments, it is necessary to have this process as moving directly on to the compression step, otherwise the resultant data would be null or void arriving to a corrupt data set. If the data is faulty, FIG. 1 proceeds to 126 and stops.

If the data is not faulty, then at 108 a compression routine begins, as is discussed in more detail below with respect to FIG. 3 below. At 110, the next data is read, which includes the source file.

At 112, independent component analysis is performed to analyze the independent data stream. Independent component analysis (ICA) finds the independent components (also called factors, latent variables, or sources) by maximizing the statistical independence of the estimated components. There are many ways to define independence, and this choice governs the form of the independent component analysis algorithm. The two broadest definitions of independence for independent component analysis are (i) minimization of mutual information and (ii) maximization of non-Gaussianity.

At 114, the data bits from the independent component analysis in 112 are verified. At 116, compression types are compared. At 118, a lossy compression routine is selected. Alternatively, at 120, a lossless compression routine is selected. At 122, the specified compression routine is executed. At 124, the size of the output file is determined. At 126, the compression process terminates with compressed output data.

Figure 2:
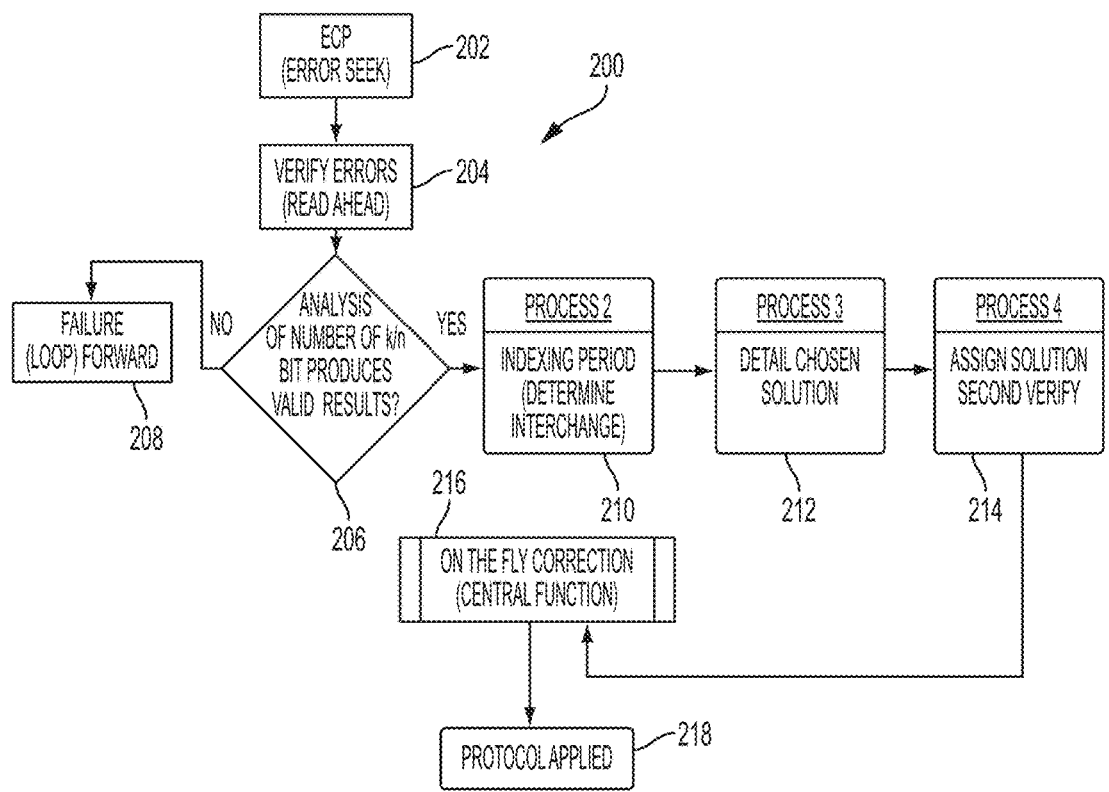
FIG. 2 depicts a flowchart for an error correction profile, according to one or more embodiments shown and described herein.

Turning to FIG. 2, an exemplary flow chart 200 depicts the operation of an error correction profile (ECP). Put another way, this allows encoding of all bits as predetermined by the error correcting protocol, which in turn allows for prediction based determination of the algorithm. This would improve and decrease varied output size by assuming a determined amount of encodes. Therefore, this can result in handling the bit as 1 to unbound the extrapolated data before being transformed back to the next bit. Further, this also provides for improving the compression matrix resulting in stationary and "clean" data sets inside of existing compression limitations.

At 202, error correction begins after source file input. The input file data is analyzed to determine deficiencies contained in the source input to prevent corruption in the final "file" output later. At 204, this analysis is utilized to verify errors and determine the amount of overall errors derived from the input file.

At 206, a first ECP process performs an overall analysis with respect to k/n bits that are provisioned from within the data source (as determined at 202) as error correction begins against the source input where, in some embodiments, k=1 and n=number of errors deciphered from the stream process. If the analysis at 206 produces an invalid result, then at 208 a failure may result in a "hard stop" with a loop forward in some embodiments. In some embodiments, an alert may be generated.

If the analysis at 206 provides a valid result, then at 210 a second ECP process determines errors from within the analysis at 206 are indexed to determine the logical number of errors and corrections needed. At 212, a third ECP process determines and assigns a solution based on the analysis at 210, wherein a second verification is performed and the indexed errors to be remediated are prepared, prior to assigning the solution to the file at 214.

At 214, a fourth ECP process assigns the solution, with the solution having been determined based on any correcting errors determined at 210. At 216, the ECP central function (or central apparatus function) relates back to the third and fourth ECP processes. The ECP central function corrects in real-time (in some embodiments) the actual errors to be removed (when possible) before applying the entire protocol, with the protocol being defined at 202. At 218, the protocol is finalized and applied from the ECP at 202.

Figure 3:
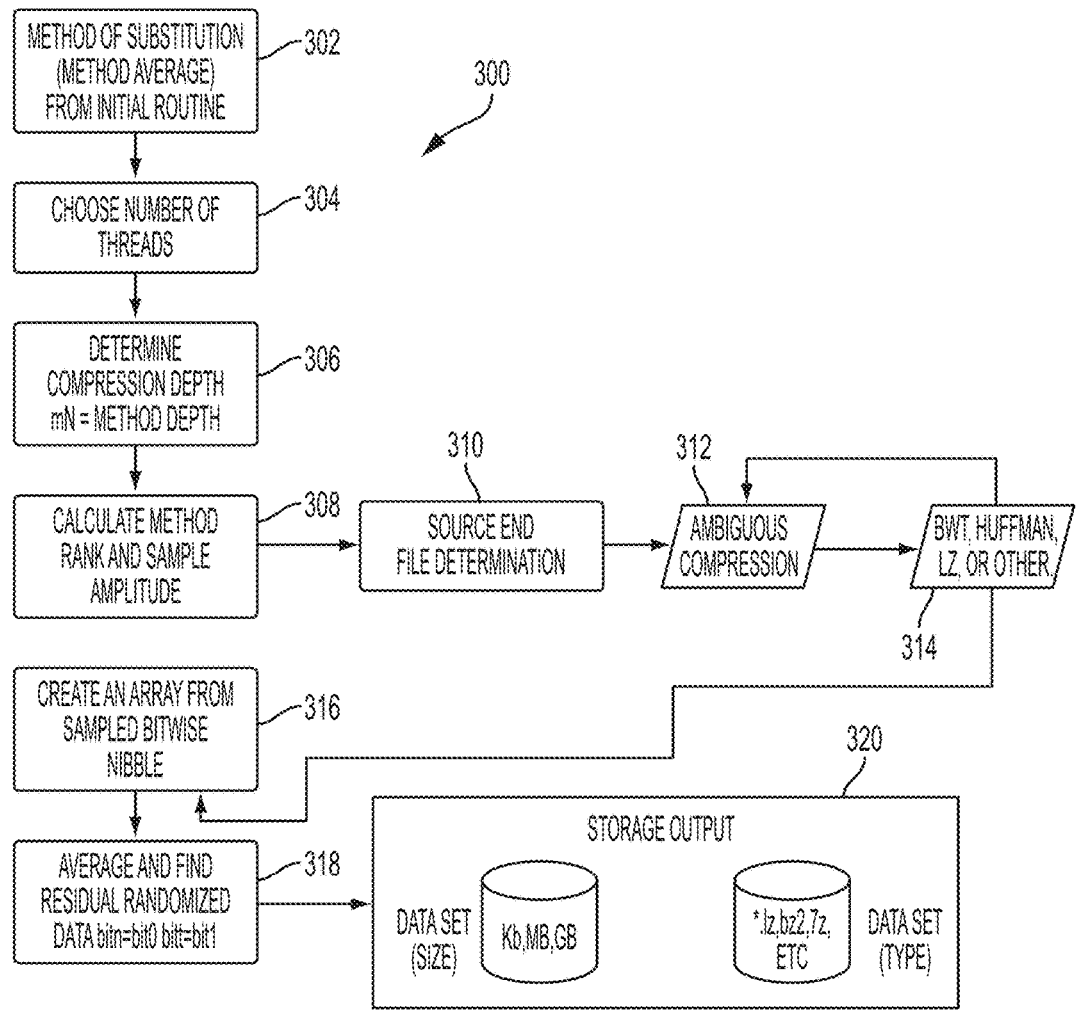
FIG. 3 depicts a flowchart for beginning a compression routine, according to one or more embodiments shown and described herein.

Turning to FIG. 3, an exemplary flow chart 300 depicts the beginning of a compression routine. The use of compression with several different co-existing algorithms to see which one leads to the least disembodiment of muxing. As a result, the process of compression is improved, through the operation of the consequent refinement. Specifically, if a rate of compression cannot be improved for the current adaptive transformation generation with an existing operation, it will still achieve compression. The parameters of the process of compression are accumulated in a protocol, thus allowing for a completely reversible decompression process. The protocol comprises predetermined and calculated parameters: the amplitude, lengths of input stream of numbered sequences and dictionaries, arithmetic and/or provisioned data for each predetermined value for the mean average within the provisioned protocol, etc. This allows for the transformation of the number of encodes.

At 302, input of the source file (104 FIG. 1) is received for later compression, such as by a method of substitution (method average) from an initial routine. At 304, a number of threads are chosen based on the machine type and resource capabilities of the machine/computer. At 306, compression depth is determined, where method depth equals mN. In one embodiment, m is the method used herein, where as n is the actual number corresponding 1-8 which are levels of compression 8 being the highest level of compression to include a content mixing technique. Other embodiments may use other values for n. From the determined resources at 304, compression is selected from the machine. In this embodiment, the code will then select a method 1-8 as determined by ZMT and process the information from the chosen algorithm, as described below at 314.

At 308, method ranks are calculated and sample amplitudes are generated. First, a sum and size set are determined from 306. Method rank is then determined from the selected method, as calculated at 304. At 310, thread resources from the selected method 304 and the method 306 chosen algorithm forward the stream to ambiguous compression at 312 (in the context of the source file discussed above at 104 of FIG. 1). At 312, the beginning phase of algorithm selection 314 is implemented. This functions as a prelude to 314, specifically the actual selection of the algorithm to be used in the compression itself (in the context of the source file discussed above at 104 of FIG. 1 and the executed specified routine in 122 of FIG. 1).

At 314, a compression algorithm is selected. Actual algorithms selected to be used may include Burrow Wheelers, Huffman, Entropy, ZMT, or any other suitable compression technique (in the context of the source file discussed above at 104 of FIG. 1 and the executed specified routine in 122 of FIG. 1). The algorithmic portion can then be transmitted.

At 316, one or more transmissions of the algorithmic portion are then used to create an array. Creation of the data array from the nibble is based on the algorithm selected at 314. A nibble can be a small portion of the sampling chosen in the original stream input (in the context of the executed specified routine in 122 of FIG. 1).

At 318, an average is taken and residual randomized data is found where bitn=bit0 and bitt=bit1, which are for comparison of the averages within the provided streams. Source as bitn=bit0 as relation to the average of data taken from analysis and comprising a theoretical table to deduce data from in-progressing the technique of compression. These are binary switching for 0&1 in the hex format applying both to bitt and bitn. This is used in off/on switching in "binary data" (i.e., 0 and 1) being binary to calculate the amount of the desired data to be re-inserted into the data set, which can relate to either lossy or lossless compression (in the context of the executed specified routine in 122 of FIG. 1). At 320 storage output is utilized for the eventual portion of final compression theory, which relates to how the data file will be output into a compressed file type (in the context of the determined output file size in 124 of FIG. 1).

Figure 4A:
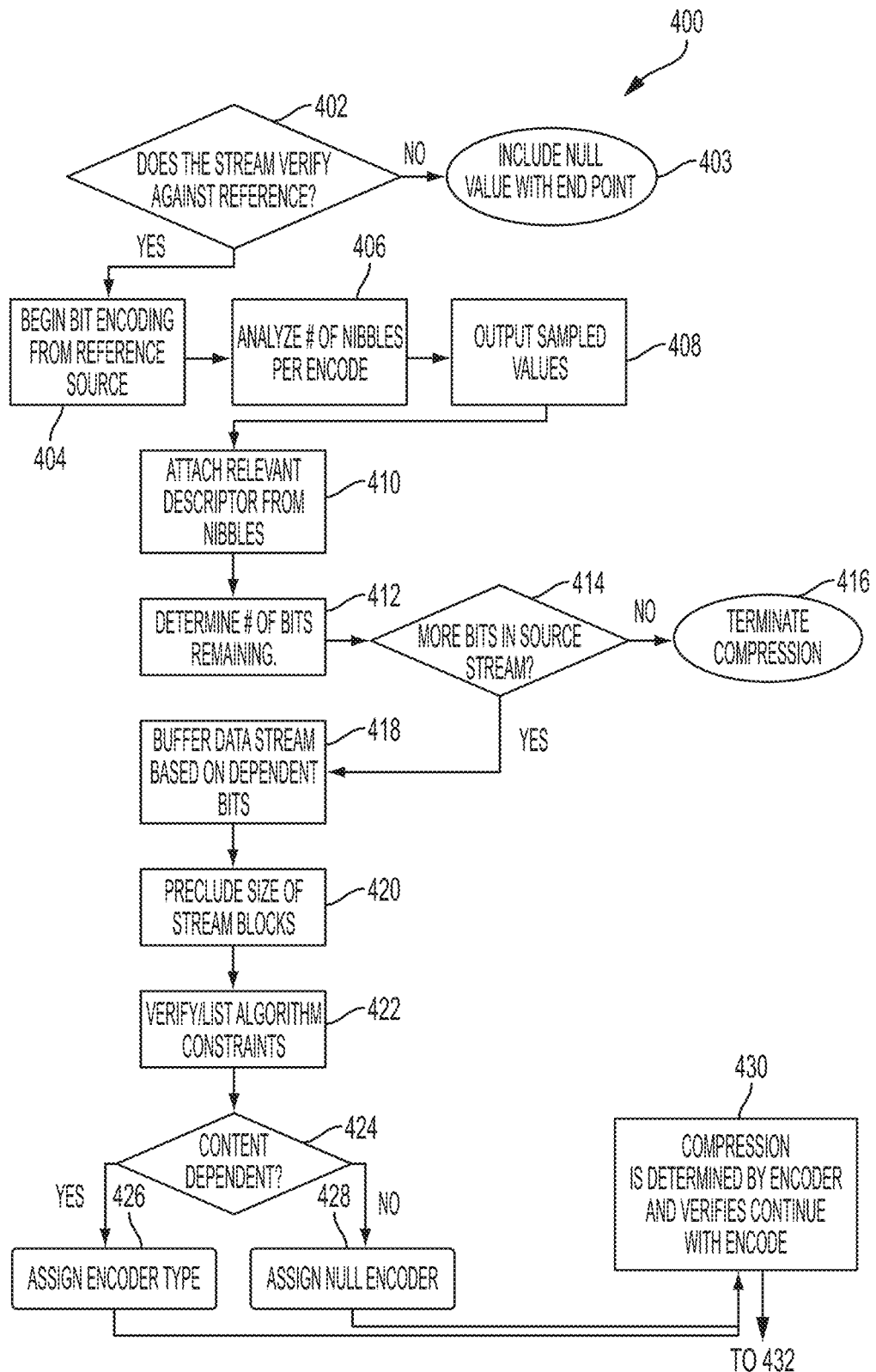
FIGS. 4A-4B depict a flowchart for compression using independent component analysis, according to one or more embodiments shown and described herein.

Turning to FIG. 4A, an exemplary flow chart 400 depicts compression using independent component analysis. At 402, the stream (referring back to the data stream in 104 of FIG. 1) is verified against a reference point. The reference point may be a sample of the data included within ICA for component analysis. If the stream does not verify at 402, then at 403 a null value is included with an end point. Null may mean a blank reference or an instructed value as a common or general point.

At 404, if the stream verifies against the reference, then encoding of the actual input source may proceed. At 406, the number of nibbles per encode is determined, which relates to chewed samples or small sample pieces from the encode values from within input (referring back to the data stream in 104 of FIG. 1).

At 408, sampled values are output. The sampled values are derived from encoding of the source file. At 410, at least one relevant descriptor may be attached from the nibbles. The descriptor is the hex assigned by the algorithm as the number of bits against the stream to encode. At 412, the number of bits remaining is determined, which may be how many bits are included inside of the analyzed stream of input remain to be encoded.

At 414, a determination is made as to whether more bits remain in the source stream. Put another way, this determines whether there more actual bits remaining in the source stream as overhead from the input. If this is above a threshold, compression terminates at 416, which allows for no over-compensation. Instead, this can simply stop the process of compression, or put another way: Stop Routine (Compression). If no more bits remain in the source stream, then at 418 the buffer may fill with the appropriate stream bits to pre-allocate data for determination of the encode based against the varied bits allowed (referring back to the data stream in 104 of FIG. 1).

At 420 a preclude size of stream blocks is specified. Embodiments of the method choose whether or not to take sample bits and entropy from 412, 418 and allocate those as a block size. At 422, algorithm constraints are verified and/or listed. Embodiments may include use deflate or inflate.

At 424, a determination is made whether there is content dependence, based upon the algorithm constraints verified/listed at 422. This is a determination of the contained content within the provided source and is reliant upon the factors of video, txt, raw or other data. If there is content-dependence at 424, then at 426 an encoder is assigned whose type is based on that dependence. This can be based on determinations involving the time of method of the stream to encode executable, video, audio, other, txt. Conversely, if there is no content-dependence at 424, then a null encoder is assigned at 428. Put another way, this may assign a "blanket" method in order to simply proceed which could comparatively increase the output rate and determined output file size. It should be noted, however, that dependency is not a factor of the data stream and the encoding could continue with or without intervention of third party or other influence transformation. At 430, there is continuation with the encoding if compression is determined by the encoder and if the stream verifies, as discussed above with respect to 114 of FIG. 1.

Figure 4B:
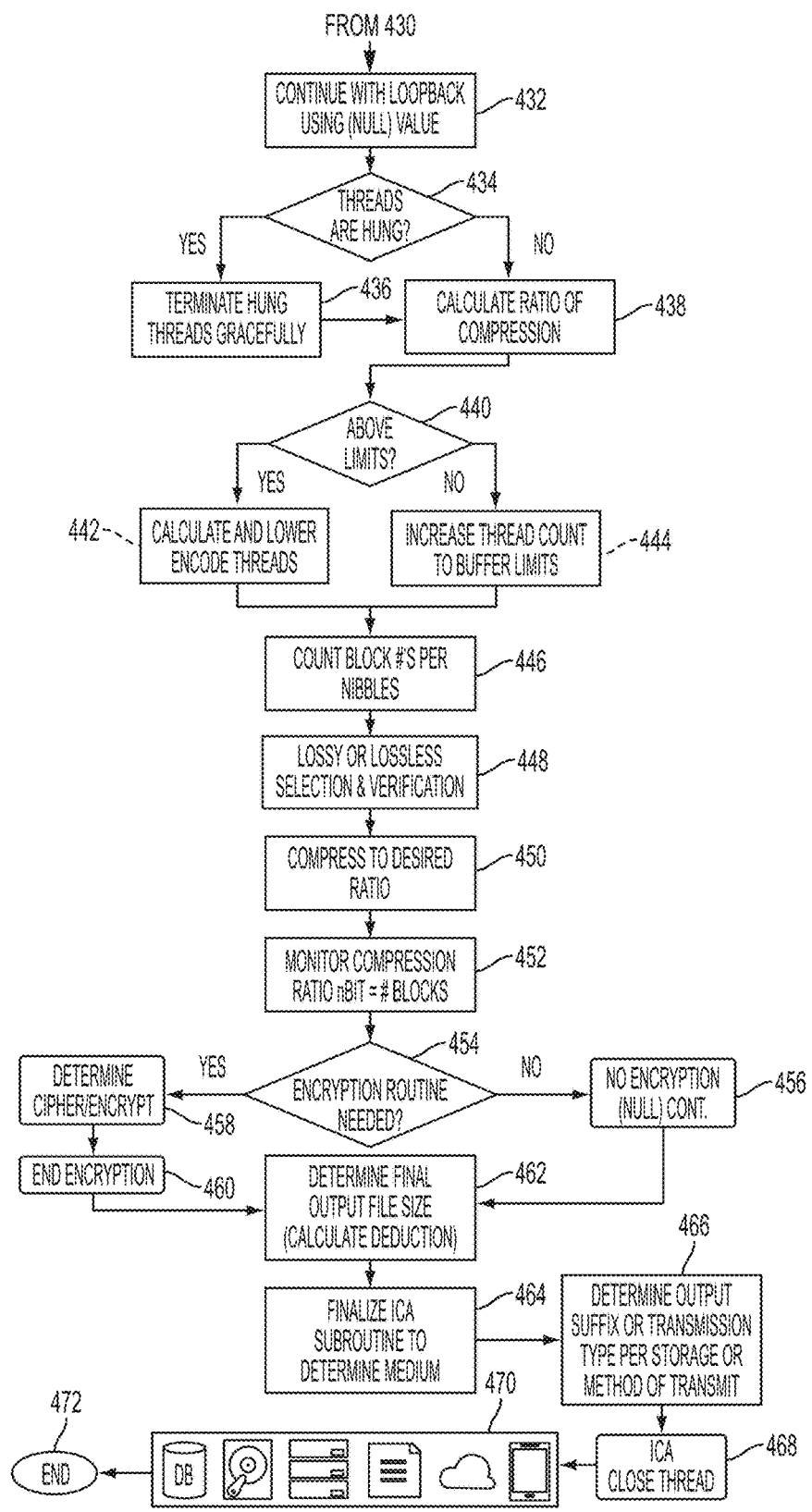

FIG. 4B continues with the flow chart in FIG. 4A. 432, proceeding from 430, continues with a loopback using a (potentially null) value. In embodiments, loopback is the forward progression from 430 using values achieved from 426, etc. (referring back to the data stream in 104 of FIG. 1). At 434 the machine resources are used to determine hung threads from among the chosen number of threads at 304.

If the threads at 434 are hung, then at 436 the hung threads may be terminated gracefully in one embodiment, and the method can proceed to 438 to calculate the ratio of compression. If the threads at 434 are not hung, then the method can proceed to 438, the ratio of physical compression is derived from the source end file determination at 310.

At 440, a determination is made as to whether the compression ratio is above a limit. In some embodiments the limit is automatically determined, wherein other embodiments may provide for receiving the compression limit from a user or other program(s). If at 440 the compression ratio is above the limit, then at 442 a calculation is performed to lower the encode threads, as determined from 302 and 408. Some embodiments may include at the limit within 'above the limit.' After this is performed, the block numbers per nibble at 446 may be counted.

If at 440 the compression ratio is below the limit (or at the limit in some embodiments), then at 444 the thread count may be increased to buffer limits. Put another way, if encoding drops below limits, then this is monitored and resources from the machine may be used to increase the buffer to prevent drop outs of data and corrupt packets in the blocks, based on the compression ratio at 438. After this is performed, the block numbers per nibble at 446 may be counted.

At 448, selection and verification of the encoding type is performed. Encode type lossy would be used to determine whether this data would be recovered upon decompression, in relation to 118 of FIG. 1. By contrast, lossless compression provides that every single bit per the stream originally remains entirely intact within the stream after a decompression process, in relation to 120 of FIG. 1.

Once the encoding type has been selected, the source stream may begin compression at 450. In one embodiment, a representation that compresses a 10 MB file to 2 MB has a compression ratio of 10/2=5, often notated as an explicit ratio, 5:1 (read "five" to "one"), or as an implicit ratio, 5/1. Note that this formulation may apply equally for compression, where the uncompressed size is that of the original, and for decompression, the uncompressed size is that of the reproduction as an example, such as in relation to 122 of FIG. 1.

At 452, the compression ratio is monitored where nBit=number of blocks. In some embodiments, this means monitoring the average variable rate of compression occurring not to extend above a particular block size whether 1 k or finite=n. At 454 a determination is made as to whether the file is to be encrypted for selection based on user input from the file source as a result that would then be displayed to the routine as a method of encryption.

If at 454 encryption is not needed or requested, then at 456 any encryption selected by the source input is not needed to verify the data as valid, and final file output size is determined at 462.

If at 454 encryption is needed or requested, then at 458 the cypher/encryption to be used is determined. This is described as the above methodology used with many repetitions in a loop, and/or cycle substituting the input with output sequence for compression, with removal of the prior encryption to decrease overhead. Disregarding the results of the process of data compression, the same process is used for encryption, because some embodiments always remove cyclic redundancy in the input data, which is the major factor used for unauthorized decryption. Other embodiments need not always removes cyclic redundancy in the input data. The next determination is the decision to use hash checks in the dictionary or statistical base, thus allowing for more efficient decodes and also removing redundant data subsets. At 460 the encryption terminates and final file output size is determined at 462.

At 462, the final file output size is determined. Calculating encryption as overhead and inserting those blocks within the data stream may allow for the calculation to deduce the actual final file size being output as compressed. At 464 ICA is the reasoning to accumulate the entire values from the compression ratio at 438, sample amplitude at 308, compression type at 314 and so on, in order to progress to 466.

At 466 a determination may be made as to an output suffix or transmission type per storage or mode of transmission. Put another way, this can be the determination from the client and/or source on whichever medium the file proposed is to be validated against as a transmittal method. At 468 the ICA thread(s) are closed, which begins transmission and encode/compress to the final output method desired.

At 470, the various storage options can be utilized, including (but not limited to) database storage, files, virtual storage, hard drive, ssd, server, network access storage, storage access network, cloud storage, clients (including desktops, laptops, tablets, smartphones, etc.), any combination thereof. At 472, the method terminates.

Figure 5:
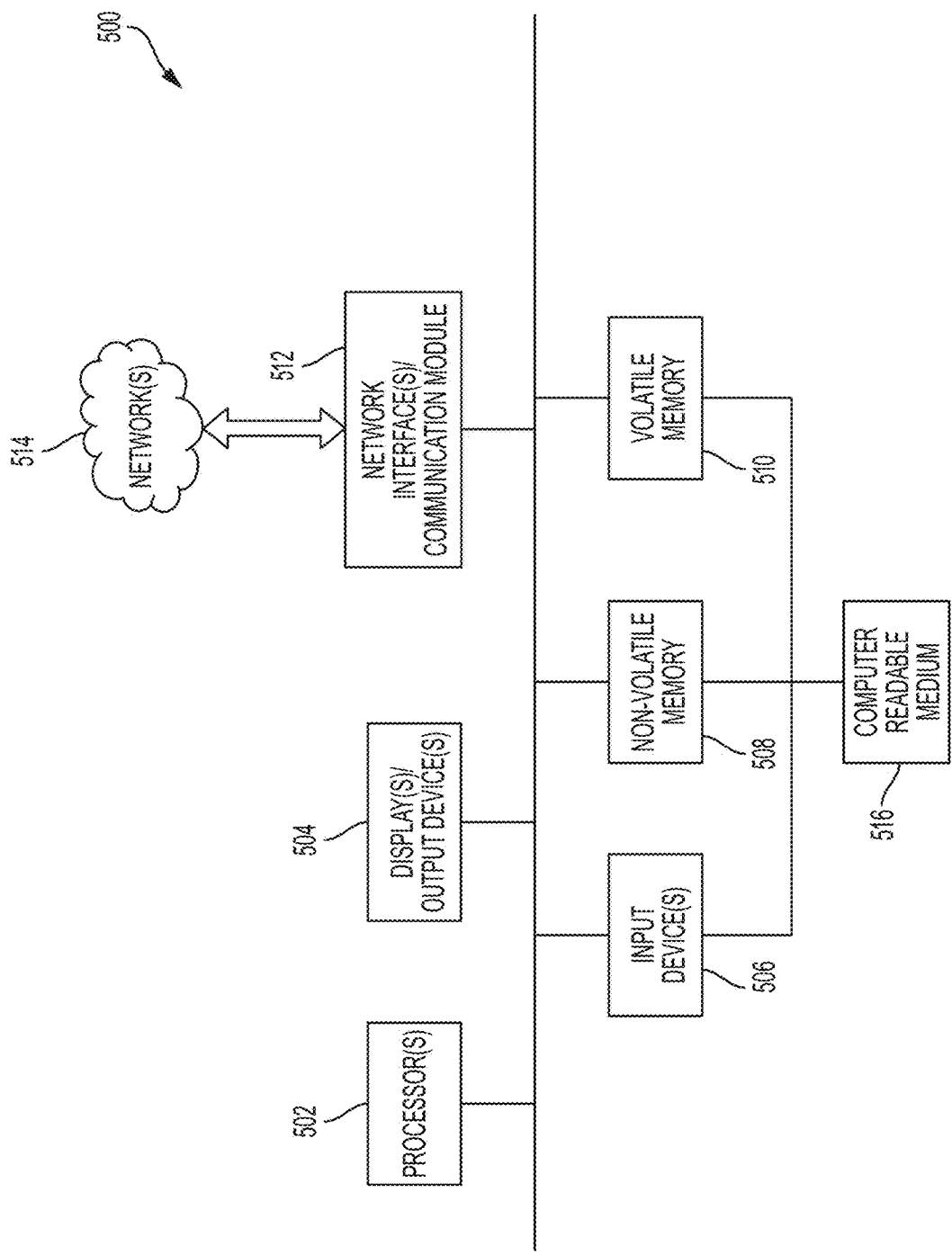
FIG. 5 schematically illustrates a computing system, according one or more embodiments shown and described herein.

Turning to FIG. 5, a block diagram illustrates an exemplary computing device 500, through which embodiments of the disclosure can be implemented. The computing device 500 described herein is but one example of a suitable computing device and does not suggest any limitation on the scope of any embodiments presented. Nothing illustrated or described with respect to the computing device 500 should be interpreted as being required or as creating any type of dependency with respect to any element or plurality of elements. In various embodiments, a computing device 500 may include, but need not be limited to, a desktop, laptop, server, client, tablet, smartphone, or any other type of device that can compress data. In an embodiment, the computing device 500 includes at least one processor 502 and memory (non-volatile memory 508 and/or volatile memory 510). The computing device 500 can include one or more displays and/or output devices 504 such as monitors, speakers, headphones, projectors, wearable-displays, holographic displays, and/or printers, for example. The computing device 500 may further include one or more input devices 506 which can include, by way of example, any type of mouse, keyboard, disk/media drive, memory stick/thumb-drive, memory card, pen, touch-input device, biometric scanner, voice/auditory input device, motion-detector, camera, scale, etc.

The computing device 500 typically includes non-volatile memory 508 (ROM, flash memory, etc.), volatile memory 510 (RAM, etc.), or a combination thereof. A network interface 512 can facilitate communications over a network 514 via wires, via a wide area network, via a local area network, via a personal area network, via a cellular network, via a satellite network, etc. Suitable local area networks may include wired Ethernet and/or wireless technologies such as, for example, wireless fidelity (Wi-Fi). Suitable personal area networks may include wireless technologies such as, for example, IrDA, Bluetooth, Wireless USB, Z-Wave, ZigBee, and/or other near field communication protocols. Suitable personal area networks may similarly include wired computer buses such as, for example, USB and FireWire. Suitable cellular networks include, but are not limited to, technologies such as LTE, WiMAX, UMTS, CDMA, and GSM. Network interface 512 can be communicatively coupled to any device capable of transmitting and/or receiving data via the network 514. Accordingly, the network interface hardware 512 can include a communication transceiver for sending and/or receiving any wired or wireless communication. For example, the network interface hardware 512 may include an antenna, a modem, LAN port, Wi-Fi card, WiMax card, mobile communications hardware, near-field communication hardware, satellite communication hardware and/or any wired or wireless hardware for communicating with other networks and/or devices.

A computer-readable medium 516 may comprise a plurality of computer readable mediums, each of which may be either a computer readable storage medium or a computer readable signal medium. A computer readable storage medium 516 may reside, for example, within an input device 506, non-volatile memory 508, volatile memory 510, or any combination thereof. A computer readable storage medium can include tangible media that is able to store instructions associated with, or used by, a device or system. A computer readable storage medium includes, by way of non-limiting examples: RAM, ROM, cache, fiber optics, EPROM/Flash memory, CD/DVD/BD-ROM, hard disk drives, solid-state storage, optical or magnetic storage devices, diskettes, electrical connections having a wire, or any combination thereof. A computer readable storage medium may also include, for example, a system or device that is of a magnetic, optical, semiconductor, or electronic type. Computer readable storage media and computer readable signal media are mutually exclusive.

A computer readable signal medium can include any type of computer readable medium that is not a computer readable storage medium and may include, for example, propagated signals taking any number of forms such as optical, electromagnetic, or a combination thereof. A computer readable signal medium may include propagated data signals containing computer readable code, for example, within a carrier wave. Computer readable storage media and computer readable signal media are mutually exclusive.

The computing device 500 may include one or more network interfaces 512 to facilitate communication with one or more remote devices 518, which may include, for example, client and/or server devices. A network interface 512 may also be described as a communications module, as these terms may be used interchangeably.

It is noted that recitations herein of a component of the present disclosure being "configured" or "programmed" in a particular way, to embody a particular property, or to function in a particular manner, are structural recitations, as opposed to recitations of intended use. More specifically, the references herein to the manner in which a component is "configured" or "programmed" denotes an existing physical condition of the component and, as such, is to be taken as a definite recitation of the structural characteristics of the component.

The order of execution or performance of the operations in examples of the disclosure illustrated and described herein is not essential, unless otherwise specified. That is, the operations may be performed in any order, unless otherwise specified, and examples of the disclosure may include additional or fewer operations than those disclosed herein. For example, it is contemplated that executing or performing a particular operation before, contemporaneously with, or after another operation is within the scope of aspects of the disclosure.

It is noted that the terms "substantially" and "about" and "approximately" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue. While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method for compressing data comprising:
producing a generated stream of numbered sequences by transforming an input stream into a sequence of samples each having a predetermined amplitude and a predetermined length;
applying an error correction protocol through an analysis of a number of bits;
upon determining that the data in the generated stream is not faulty, implementing a compression routine by choosing a number of threads and determining compression depth;
performing a subsequent data read including a source file;
analyzing the stream utilizing independent component analysis;
verifying data bits from the independent component analysis;
comparing compression types;
selecting a lossy compression type or a lossless compression type;
executing a specified compression routine; and
determining an output file size.

2. The method of claim 1, wherein applying an error correction protocol further comprises an indexing period, an assigned solution, and an injected serialized value.

3. The method of claim 1, wherein beginning a compression routine further comprises:
calculating method ranks and sample amplitudes;
creating an array from a sampled bitwise nibble; and
averaging and finding residual randomized data.

4. The method of claim 1, further comprising:
buffering the data stream based on dependent bits;
precluding a size of stream blocks; and
verifying or listing algorithm constraints.

5. The method of claim 1, wherein the independent component analysis further comprises an encryption routine.

6. The method of claim 1, further comprising:
calculating a ratio of compression;
lowering a quantity of encoding threads based upon the compression ratio being above a compression limit;
increasing the encoding thread count to buffer limits based upon the compression ratio being above the compression limit;
counting block numbers per nibble;
compressing to a specified compression ratio; and
monitoring the compression ratio.

7. The method of claim 1, further comprising determining an output suffix or transmission type based on the type of storage or method of transmission.

8. A data compression system comprising:
memory and a processor coupled to the memory; and
a data compression component configured to:
produce a generated stream of numbered sequences by transforming an input stream into a sequence of samples each having a predetermined amplitude and a predetermined length;
apply an error correction protocol through an analysis of a number of bits;
upon determining that the data in the generated stream is not faulty, implement a compression routine by choosing a number of threads and determining compression depth;
perform a subsequent data read including a source file;
analyze the stream utilizing independent component analysis;
verify data bits from the independent component analysis;
compare compression types;
select a lossy compression type or a lossless compression type;
execute a specified compression routine; and
determine an output file size.

9. The system of claim 8 wherein applying an error correction protocol further comprises an indexing period, an assigned solution, and an injected serialized value.

10. The system of claim 8 wherein the data compression component is further configured to:
calculate method ranks and sample amplitudes;
create an array from a sampled bitwise nibble; and
average and find residual randomized data.

11. The system of claim 8 wherein the data compression component is further configured to:
buffer the data stream based on dependent bits;
preclude a size of stream blocks; and
verify or list algorithm constraints.

12. The system of claim 8 wherein the independent component analysis further comprises an encryption routine.

13. The system of claim 8 wherein the data compression component is further configured to:
calculate a ratio of compression;
lower a quantity of encoding threads based upon the compression ratio being above a compression limit;
increase the encoding thread count to buffer limits based upon the compression ratio being above the compression limit;
count block numbers per nibble;
compress to a specified compression ratio; and
monitor the compression ratio.

14. The system of claim 8 wherein the data compression component is further configured to determine an output suffix or transmission type based on the type of storage or method of transmission.

15. A non-transitory computer readable medium embodying computer-executable instructions, that when executed by a processor, cause the processor to execute operations comprising:
producing a generated stream of numbered sequences by transforming an input stream into a sequence of samples each having a predetermined amplitude and a predetermined length;
applying an error correction protocol through an analysis of a number of bits;
upon determining that the data in the generated stream is not faulty, implementing a compression routine by choosing a number of threads and determining compression depth;
performing a subsequent data read including a source file;
analyzing the stream utilizing independent component analysis;
verifying data bits from the independent component analysis;
comparing compression types;
selecting a lossy compression type or a lossless compression type;

executing a specified compression routine; and
determining an output file size.

16. The medium of claim 15, wherein applying an error correction protocol further comprises an indexing period, an assigned solution, and an injected serialized value.

17. The medium of claim 15 including additional operations that further comprise:
calculating method ranks and sample amplitudes;
creating an array from a sampled bitwise nibble; and
averaging and finding residual randomized data.

18. The medium of claim 15 including additional operations that further comprise:
buffering the data stream based on dependent bits;
precluding a size of stream blocks; and
verifying or listing algorithm constraints.

19. The medium of claim 15 including additional operations that further comprise:
calculating a ratio of compression;
lowering a quantity of encoding threads based upon the compression ratio being above a compression limit;
increasing the encoding thread count to buffer limits based upon the compression ratio being above the compression limit;
counting block numbers per nibble;
compressing to a specified compression ratio; and
monitoring the compression ratio.

20. The medium of claim 15 including additional operations that further comprise determining an output suffix or transmission type based on the type of storage or method of transmission.

* * * * *